United States Patent
Huang

(10) Patent No.: US 9,514,843 B2
(45) Date of Patent: Dec. 6, 2016

(54) METHODS FOR ACCESSING A STORAGE UNIT OF A FLASH MEMORY AND APPARATUSES USING THE SAME

(71) Applicant: Silicon Motion, Inc., Jhubei, Hsinchu County (TW)

(72) Inventor: Han-Cheng Huang, Taipei (TW)

(73) Assignee: SILICON MOTION, INC., Jhubei, Hsinchu County (TW)

(*) Notice: Subject to any disclaimer, the term of this patent is extended or adjusted under 35 U.S.C. 154(b) by 72 days.

(21) Appl. No.: 14/326,731

(22) Filed: Jul. 9, 2014

(65) Prior Publication Data

US 2015/0143188 A1     May 21, 2015

(30) Foreign Application Priority Data

Nov. 15, 2013  (TW) .............................. 102141595 A

(51) Int. Cl.

| | | |
|---|---|---|
| G11C 29/00 | (2006.01) | |
| G11C 29/24 | (2006.01) | |
| G11C 29/30 | (2006.01) | |
| G11C 29/08 | (2006.01) | |
| G06F 11/10 | (2006.01) | |
| G11C 16/00 | (2006.01) | |
| G11C 29/12 | (2006.01) | |
| G11C 29/44 | (2006.01) | |

(52) U.S. Cl.
CPC ............ *G11C 29/24* (2013.01); *G06F 11/1008* (2013.01); *G11C 29/08* (2013.01); *G11C 29/30* (2013.01); *G11C 29/82* (2013.01); *G11C 16/00* (2013.01); *G11C 2029/1204* (2013.01); *G11C 2029/4402* (2013.01)

(58) Field of Classification Search
CPC ....... G11C 29/24; G11C 29/82; G11C 29/08; G11C 29/30; G11C 16/00; G11C 2029/4402; G11C 2029/1204; G06F 11/1008
See application file for complete search history.

(56) References Cited

U.S. PATENT DOCUMENTS

| | | | | |
|---|---|---|---|---|
| 2003/0005353 | A1* | 1/2003 | Mullins ................. | G11C 29/44 714/5.11 |
| 2008/0244340 | A1* | 10/2008 | Doi ........................ | G11C 29/56 714/711 |
| 2011/0292741 | A1* | 12/2011 | Hsieh .................... | G11C 29/846 365/189.05 |
| 2012/0036404 | A1* | 2/2012 | Tabata ................... | G11C 29/56 714/722 |
| 2012/0297245 | A1* | 11/2012 | Li ......................... | G11C 29/808 714/15 |
| 2013/0254605 | A1 | 9/2013 | Whetsel | |
| 2014/0043918 | A1* | 2/2014 | Ellis ....................... | G11C 8/08 365/189.02 |
| 2014/0043925 | A1* | 2/2014 | Lin ........................ | G11C 8/18 365/193 |

* cited by examiner

*Primary Examiner* — Bryce Bonzo
*Assistant Examiner* — Thien D Nguyen
(74) *Attorney, Agent, or Firm* — McClure, Qualey & Rodack, LLP

(57) ABSTRACT

An embodiment of a method for accessing a storage unit of a flash memory, performed by a control unit, is disclosed to include at least the following steps. A transaction is appended to a bad-column table each time a bad column of a block within the storage unit is inspected. It is determined whether a total number of the transactions within the bad-column table is odd when the control unit determines that the last column of the block is a regular column. A transaction is appended to the bad-column table to indicate that the last column of the block is a bad column when the control unit determines that the total number of the transactions within the bad-column table is odd.

17 Claims, 9 Drawing Sheets

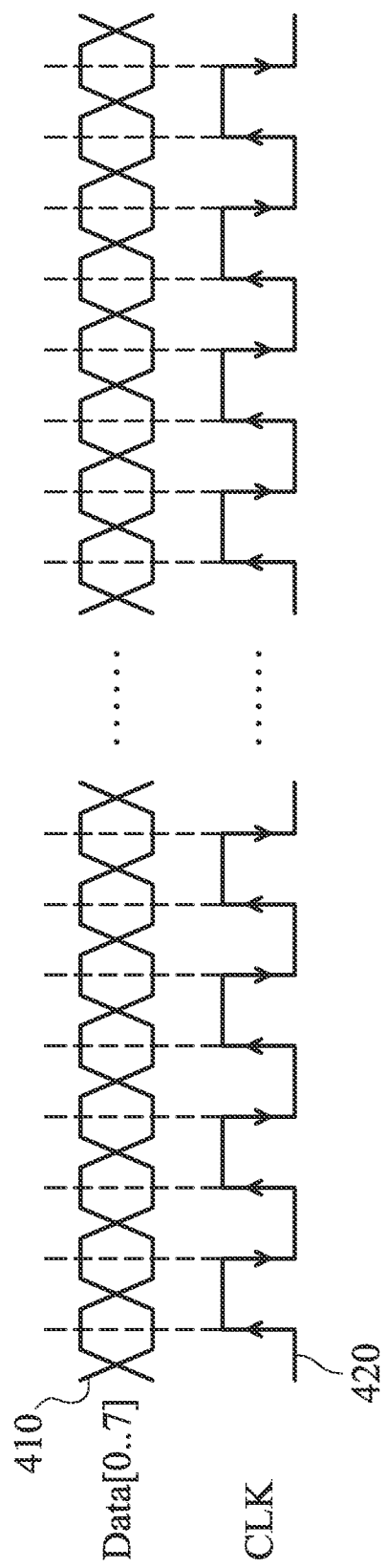

METHODS FOR ACCESSING A STORAGE UNIT OF A FLASH MEMORY AND APPARATUSES USING THE SAME

CROSS REFERENCE TO RELATED APPLICATIONS

This Application claims priority of Taiwan Patent Application No. 102141595, filed on Nov. 15, 2013, the entirety of which is incorporated by reference herein.

BACKGROUND

Technical Field

The present invention relates to flash memory, and in particular to methods for accessing a storage unit of a flash memory and apparatuses using the same.

Description of the Related Art

Particles or mask defects in manufacturing a flash memory may cause a failure of a whole column of a storage unit of the flash memory to be accessed. Conventional techniques may append ECC (Error Correction Code) to data and attempt to use the ECC to restore data in these inaccessible columns. However, the flash memory malfunctions when bad columns are too numerous to be restored by ECC. Accordingly, what is needed are methods for accessing a storage unit of a flash memory to prevent flash memory malfunctions when the aforementioned problem appears, and apparatuses using the flash memory.

BRIEF SUMMARY

An embodiment of a method for accessing a storage unit of a flash memory, performed by a control unit, is disclosed to include at least the following steps. A transaction is appended to a bad-column table each time a bad column of a block within the storage unit is inspected. It is determined whether a total number of transactions within the bad-column table is odd when the control unit determines that the last column of the block is a regular column. A transaction is appended to the bad-column table to indicate that the last column of the block is a bad column when the control unit determines that the total number of transactions within the bad-column table is odd.

An embodiment of an apparatus for accessing a storage unit of a flash memory is disclosed to include at least a non-volatile memory storing a bad-column table, and a control unit. The control unit appends a transaction to the bad-column table each time a bad column of a block within the storage unit is detected, determines whether a total number of transactions within the bad-column table is odd when determining that the last column of the block is a regular column, and appends a transaction to the bad-column table to indicate that the last column of the block is a bad column when determining that the total number of transactions within the bad-column table is odd.

Another embodiment of a method for accessing a storage unit of a flash memory, performed by a control unit, is disclosed to include at least the following steps. Bad columns of each block within a storage unit are inspected. A bad-column table is generated according to the inspection results. The total number of transactions within the bad-column table for each block is even. A total number of transactions for each block equals a total number of actual malfunctioning columns, or actual malfunctioning columns plus one.

A detailed description is given in the following embodiments with reference to the accompanying drawings.

BRIEF DESCRIPTION OF THE DRAWINGS

The present invention can be fully understood by reading the subsequent detailed description and examples with references made to the accompanying drawings, wherein:

FIG. 4 is a timing diagram on a storage-unit access interface according to an embodiment of the invention;

DETAILED DESCRIPTION

The following description is of the best-contemplated mode of carrying out the invention. This description is made for the purpose of illustrating the general principles of the invention and should not be taken in a limiting sense. The scope of the invention is best determined by reference to the appended claims.

The present invention will be described with respect to particular embodiments and with reference to certain drawings, but the invention is not limited thereto and is only limited by the claims. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

Figure 1:
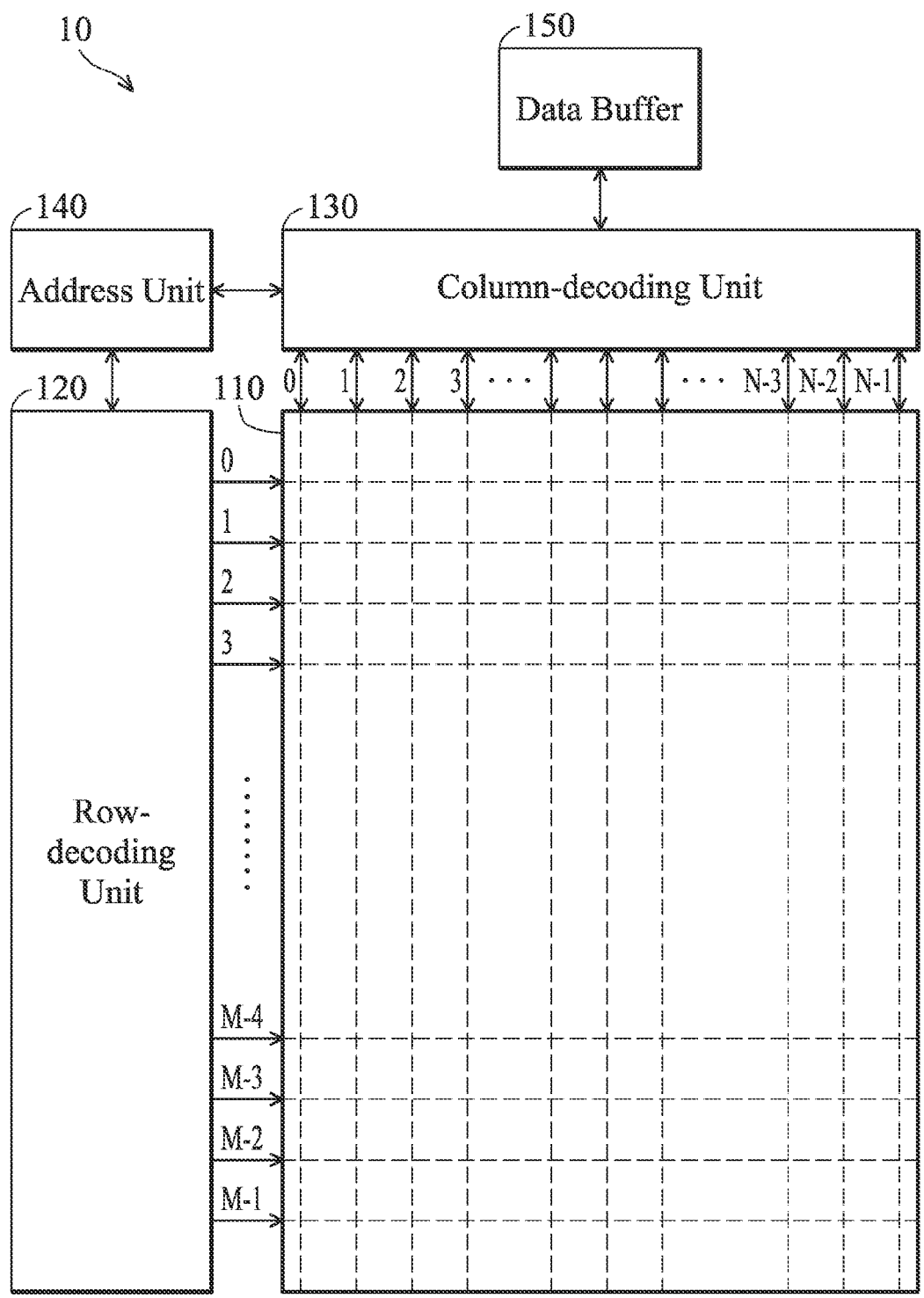
FIG. 1 shows a schematic diagram depicting a storage unit of a flash memory according to an embodiment of the invention.

Embodiments of the invention introduce methods for accessing a storage unit of a flash memory and apparatuses using the same to prevent flash memory malfunctions caused by too many inaccessible columns. FIG. 1 shows a schematic diagram depicting a storage unit of a flash memory according to an embodiment of the invention. A storage unit 10 includes an array composed of M×N memory cells, and each memory cell may store one byte of information. The flash memory may be a NOR or NAND flash memory, etc.

In order to appropriately access desired information, a row-decoding unit 120 is used to select appropriate row lines for access. Similarly, a column-decoding unit 130 is employed to select an appropriate number of bytes within the row for output. An address unit 140 applies row information to the row-decoding unit 120 defining which of the N rows of the memory cell array 110 is to be selected for reading or writing. Similarly, the column-decoding unit 130 receives address information defining which one or ones of the M columns of the memory cell array 110 are to be selected. Data read from or to be applied to the memory cell array 110 is stored in a data buffer 150. However, certain columns of the memory cell array 110 may be inaccessible due to particles or mask defects in manufacturing, referred to as bad columns. The rows may also be referred to as word lines and the columns may also be referred to as bit lines.

Figure 2:
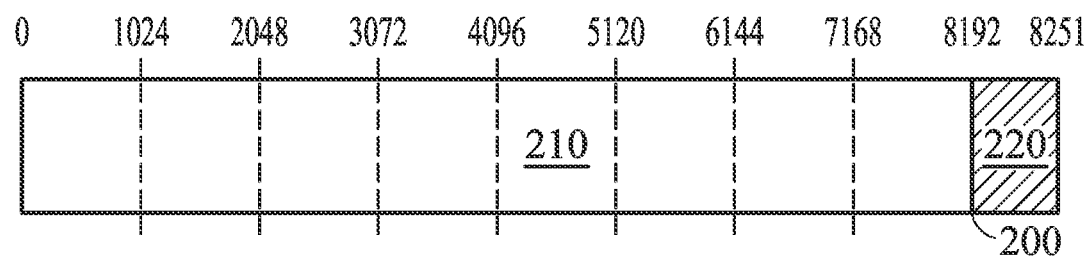
FIG. 2 is a schematic diagram illustrating memory cell segmentation for one row before a bad-column inspection according to an embodiment of the invention.

In order to address the aforementioned problem caused by bad columns, the memory cell array 110 contains a specific number of spare memory cells used to store ECC and to provide spare storage space substituting for the bad columns. FIG. 2 is a schematic diagram illustrating memory cell segmentation for one row before a bad-column inspection according to an embodiment of the invention. Any row 200 of a memory cell array may contain a specified number of data columns 210 and a specified number of spare columns (in shadow) 220. For example, assume that each row contains 8 blocks and each block contains 1024 columns: Ideally, the total number of data columns 210 storing data is 8192 (1024×8), labeled from 0 to 8191. The manufacture additionally provides 60 spare columns 220 labeled from 8192 to 5851 for each row, which are utilized to store ECC and substitute for bad columns appearing in the data columns 210.

Figure 3:
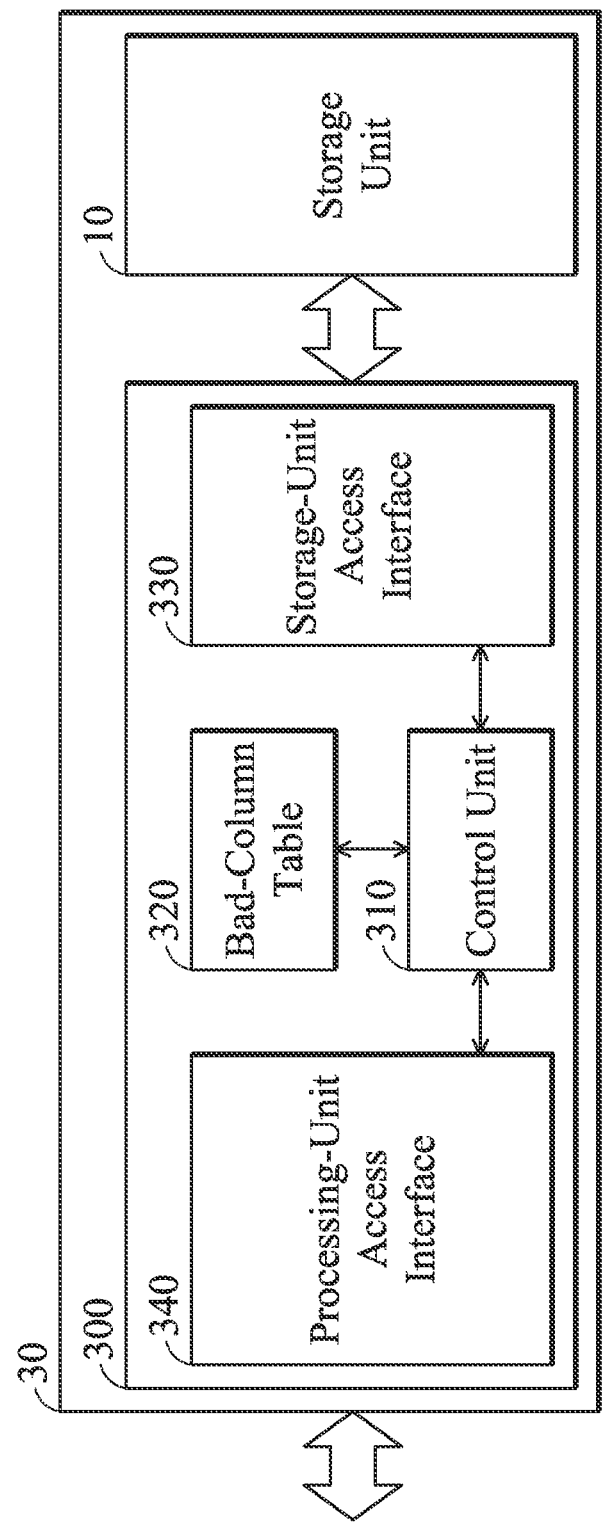
FIG. 3 is the system architecture of a flash memory according to an embodiment of the invention.

FIG. 3 is the system architecture of a flash memory according to an embodiment of the invention. The system architecture 30 of the flash memory contains a controller 300 being configured to write data into a designated address of the storage unit 10, and read data from a designated address thereof. Specifically, a control unit 310 writes data into a designated address of the storage unit 10 through a storage-unit access interface 330 and reads data from a designated address thereof through the same interface 330. The system architecture 30 uses several electrical signals for coordinating commands and data transfer between the controller 300 and the storage unit 10, including data lines, a clock signal and control lines. The data lines are employed to transfer commands, addresses and data to be written and read. The control lines are utilized to issue control signals, such as ALE (Address Latch Enable), CLE (Command Latch Enable), WE (Write Enable), etc. The control unit 310 may communicate with other electronic devices through processing-unit access interface 340 using a standard protocol, such as USB (Universal Serial Bus), ATA (Advanced Technology Attachment), or others. Because the memory cell array 110 may have bad columns resulting from the instability of the manufacturing process, the control unit 310 selects one or more rows to inspect the bad columns on the selected row(s), such as the 0th row, or the 0- to 1st rows, and records the serial numbers of the inspected bad columns in a bad-column table 320 during a pre-test before leaving a factory. The bad-column table 320 may be practiced in a non-volatile memory, in which data will not disappear during power-down or power loss.

The storage-unit access interface 330 may communicate with the storage unit 10 using a DDR (double data rate) protocol, such as ONFI (open NAND flash interface), DDR toggle, or others. FIG. 4 is a timing diagram on a storage-unit access interface according to an embodiment of the invention. For example, in the DDR specification, the controller 300 and the storage unit 10 latch data of one byte on a data line 410 at both rising and falling edges of a clock signal 420, respectively. It is apparent to those skilled in the art to modify the storage-unit access interface 330 to latch data according to a strobe signal, such as a DQS signal, other than the clock signal 420.

Specifically, in a pre-test, the control unit 310 selects a designated row for testing, writes a series of test data, for example, "0x00," "0x55," "0xAA," "0xFF," or another test pattern, into every column, and then, reads out column by column. The control unit 310 inspects whether the read-out data matches the written test data for each column. If not, the control unit 310 determines the inspected column as a bad column, and stores its serial number in the bad-column table 320. A total number of bad columns has to be even to conform to the DDR specification. In an implementation, the control unit 310 marks both the problematic column and the next as bad columns to guarantee that the resulting number of bad columns will be even, regardless of the next column being in a regular condition. It is apparent to those skilled in the art that more ECC bytes can tolerate more errors in data bytes. However, the implementation marking a double of bad columns blindly causes a reduction of space for storing ECC bytes, resulting in reduced protection. Even worse, when the marked number exceeds that of the specified spare columns, the whole storage unit 10 fails. In order to address the drawbacks produced by the aforementioned implementation, the control unit 310, when detecting a failure, marks the only inspected column as a bad column. When the inspection proceeds to the last column of every block, which is determined as a regular column, the control unit 310 further determines whether a total number of bad columns recorded in the bad-column table 320 is even, and, if not, determines that the inspected column is a bad column to guarantee that the resulting number of bad columns for every block is even. After finishing the inspection of all columns, the control unit 310 calculates how many spare columns can be used to store ECC, and accordingly calculates a total number of spare columns, which can be allocated for one block as storage space of ECC. In alternative embodiments, the control unit 310 may fix the total number of spare column being allocated for one block as storage space of ECC, and the total number of spare column will not vary with the final inspection results.

Figure 5A:
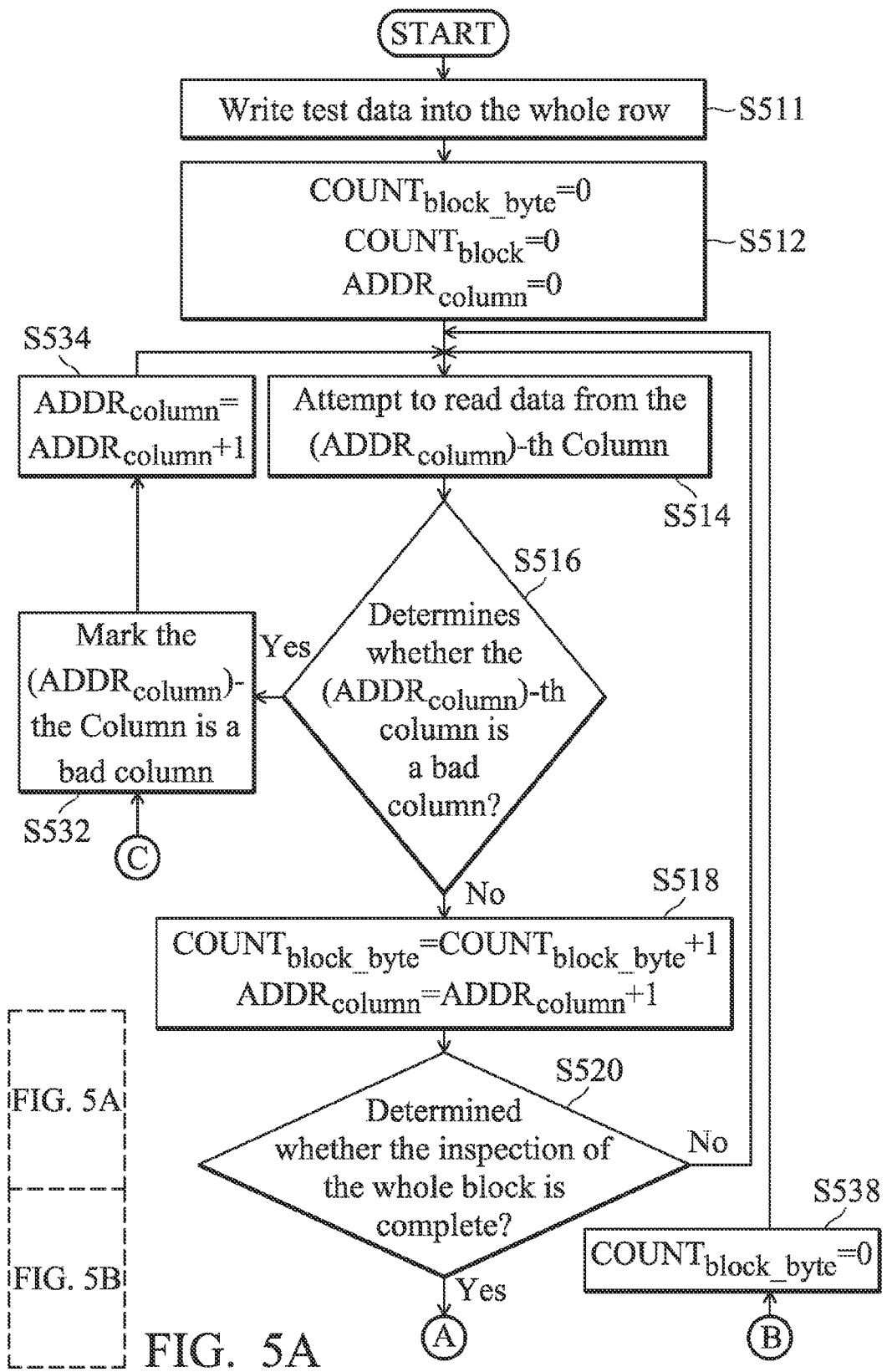
FIGS. 5A and 5B illustrate a flowchart illustrating a method for inspecting bad columns of a memory cell array according to an embodiment of the invention.
Figure 5B:
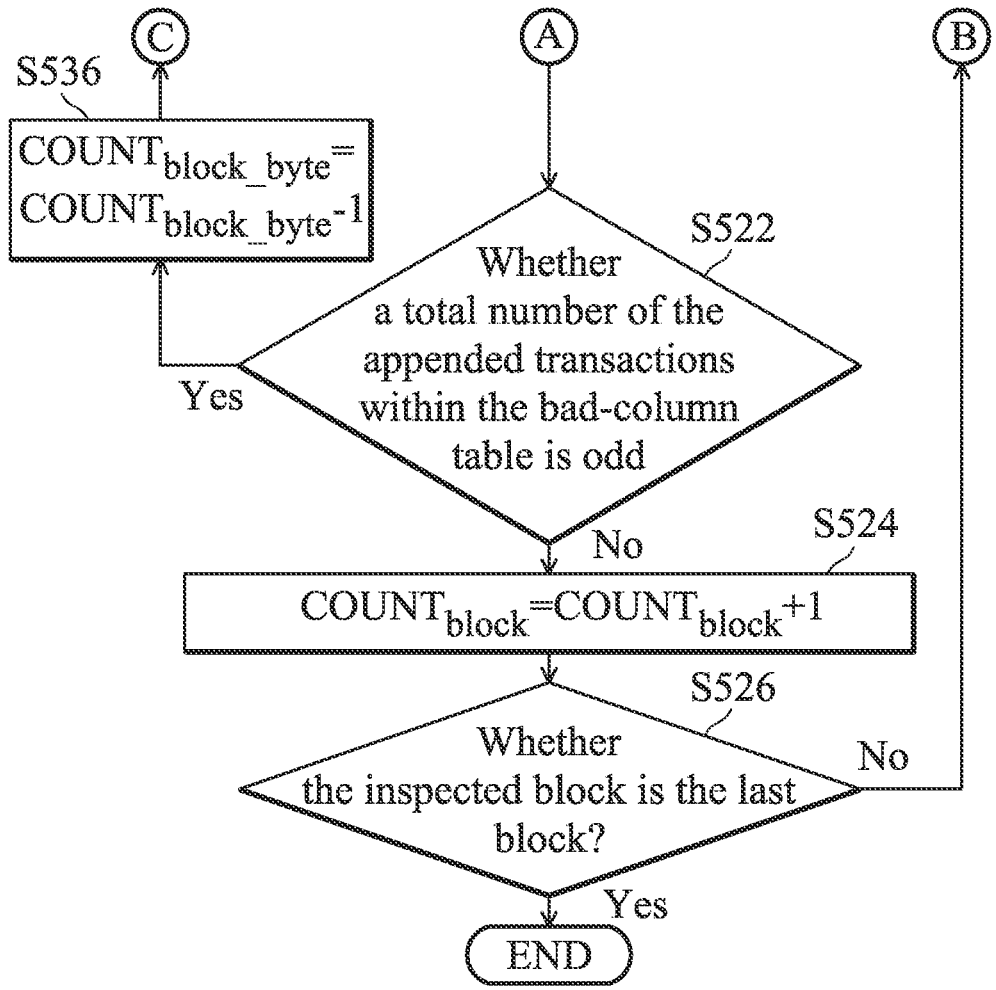

Embodiments of the invention describe the detection of a total number of bad columns for every block of each row of the storage unit 10, and generation of the bad-column table 320 according to the detection results. The generated bad-column table 320 contains an even number of transactions for each block, which equals a total number of actual malfunctioning columns, or actual malfunctioning columns plus one. FIGS. 5A and 5B illustrate a flowchart illustrating a method for inspecting bad columns of a memory cell array according to an embodiment of the invention. The following description is an example to select one row to perform the inspection. The method, performed by the control unit 310 when executing instructions with relevant data, writes test data into the whole row, and then attempts to read out data from every column and determines whether the inspected column is a bad column according to the read-out results until the last column of the last block. The process begins to write test data into the whole row (step S511), and initiates three variables "Count$_{block\_byte}$", "Count$_{block}$" and "ADDR$_{column}$" indicating a row counter, a block counter, and a counter of physical bit lines, respectively (step S512).

It is to be understood that the variables "$Count_{block\_byte}$", "$Count_{block}$" and "$ADDR_{column}$" are used to count in the process, and may not be used to represent actual addresses of the storage unit 10. The control unit 310 attempts to read out data from the ($ADDR_{column}$)-th column (step S514), and then, determines whether the ($ADDR_{column}$)-th column is a bad column (step S516). If so (the "Yes" Path of step S516), the control unit 310 appends a transaction containing the current value of the variable "$ADDR_{column}$" to the bad-column table 320 to indicate that the ($ADDR_{column}$)-th column is a bad column (step S532), and increments the variable "$ADDR_{column}$" by one so as to consider that the next inspection is applied to the next column (step S534). In step S516, specifically, the control unit 310 may read out a value from the ($ADDR_{column}$)-th column through the storage-unit access interface 330, and inspect whether the read-out value matches the test data. If not, the ($ADDR_{column}$)-th column is a bad column; otherwise, it is a regular column.

In cases where the ($ADDR_{column}$)-th column is judged as a regular column (the "No" path of step S516), the variables "$Count_{block\_byte}$" and "$ADDR_{column}$" are incremented by one, respectively, to indicate that the next inspection will be considered as the ($Count_{block\_byte}$)-th column of the ($Count_{block}$)-th block and its physical serial number is "$ADDR_{column}$" (step S518), and next, it is determined whether the inspection of the whole block is complete (step S520). In step S520, specifically, the control unit 310 may determine the variable "$Count_{block\_byte}$" equals a total number of columns within a block, such as 1024. If so, the inspection of this block is complete; otherwise, it is incomplete. If the inspection of this block is not complete (the "No" path of step S520), then the next inspection will be of the next column of the ($Count_{block}$)-th block.

In cases where the ($ADDR_{column}$)-th column is judged a regular column (the "No" path of step S516) and the inspection has reached the last column of the ($Count_{block}$)-th block (step "Yes" path of step S520), it is further determined whether a total number of the appended transactions within the bad-column table 320 is odd (step S522). If so, the control unit 310 decrements the variable "$Count_{block\_byte}$" by one (step S536), appends a transaction containing the current value of the variable "$ADDR_{column}$" to the bad-column table 320 to indicate that the ($ADDR_{column}$)-th column is a bad column (step S532), and increments the variable "$ADDR_{column}$" by one so as to consider that the next inspection is applied to the next column (step S534). It should be noted that, in order to conform to the DDR specification, the performance of steps S536, S532 and S534 in series is to guarantee that the resulting number of the transactions within the bad-column table 320 is odd after the inspection of one block is complete. In other words, by using the introduced method according to the embodiments of the invention, for every block of the storage unit 10, it is allowed to mark at most one regular column as a bad column so as to eliminate the drawbacks caused by the aforementioned implementation marking two bad columns blindly every time inspecting a bad column. If the appended transactions within the bad-column table 320 is even (the "No" path of step S522), the variable "$Count_{block}$" is incremented by one (S524), and it is determined whether the inspected block is the last block (step S526). If so (the "Yes" path of step S526), the inspection of the whole row is complete; otherwise (the "No" path of step S526), the variable "$Count_{block\_byte}$" is set to zero to indicate the next inspection will be considered as the first column of the next block (step S538). In step S526, specifically, the control unit 310 may determine the variable "$Count_{block}$" equals a total number of blocks within one row, such as 8. If so, the whole inspection ends; otherwise, it continues.

Figure 6A:
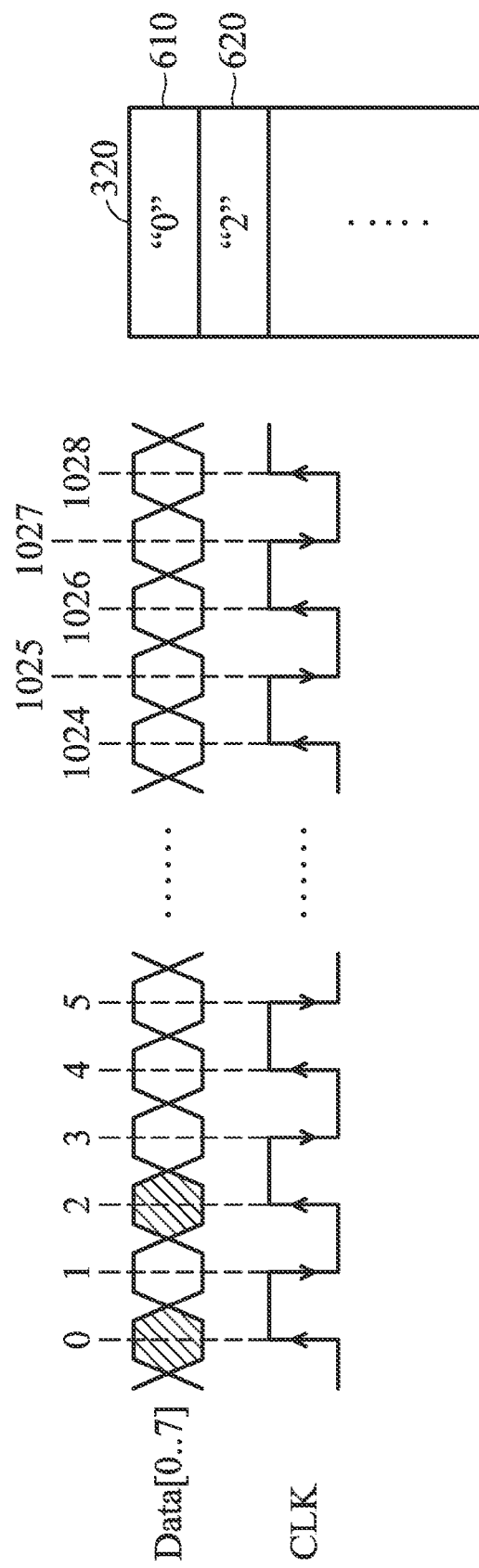
FIG. 6A is a schematic diagram illustrating a first scenario of the bad-column inspection according to an embodiment of the invention.
Figure 7:
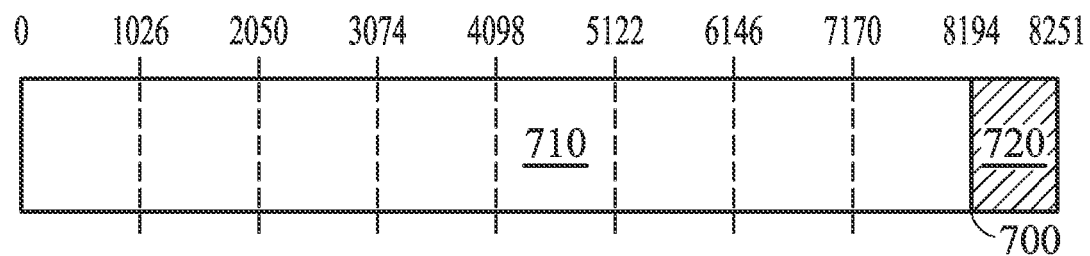
FIGS. 7 and 8 are schematic diagrams illustrating memory cell segmentation in two rows, respectively, after a bad-column inspection according to an embodiment of the invention.

The following description introduces two scenarios with reference made to the flowchart as shown in FIGS. 5A and 5B. FIG. 6A is a schematic diagram illustrating a first scenario of the bad-column inspection according to an embodiment of the invention. Assume that the 0- and 2nd physical bit lines malfunction (in shadow of the data line Data[0 . . . 7]): When the 0th column is inspected, variables "$Count_{block\_byte}$", "$Count_{block}$" and "$ADDR_{column}$" are set to 0, 0 and 0, respectively. After determining that this column is a bad column (the "Yes" path of step S516), the control unit 310 appends a transaction 610 containing the current value of the variable "$ADDR_{column}$" to the bad-column table 320 (step S532), and set the variable "$ADDR_{column}$" to 1. Next, after determining that the 1st column is a regular column (the "No" path of step S516), the control unit 310 sets the variables "$Count_{block\_byte}$" and "$ADDR_{column}$" to 1 and 2, respectively (step S518). When the 2nd column is inspected, variables "$Count_{block\_byte}$", "$Count_{block}$" and "$ADDR_{column}$" are 1, 0 and 2, respectively. After it is determined that this column is a bad column (the "Yes" path of step S516), a transaction 620 containing the current value of the variable "$ADDR_{column}$" is appended to the bad-column table 320 (step S532), and the variable "$ADDR_{column}$" is set to 3. When the 1025th column is inspected, variables "$Count_{block\_byte}$", "$Count_{block}$" and "$ADDR_{column}$" are 1023, 0 and 1025, respectively. After it is determined that this column is a regular column (the "No" path of step S516) and a total number of the transactions within the bad-column table 320 is even (the "No" path of step S522), the variable "$Count_{block}$" is set to one so as to consider that the next inspection is applied to the next block (step S524). Each of the values stored in the transactions 610 to 620 may indicate a serial number of a physical bit line. FIG. 7 is a schematic diagram illustrating memory cell segmentation in one row after a bad-column inspection according to an embodiment of the invention. After the aforementioned performance of bad-column inspection, the actual data columns 710 may be respectively segmented into the 0- to 1025th; the 1206- to 2049th; the 2050- to 3073th; the 3074- to 4097th; the 4098- to 5121th; the 5122- to 6145th; the 6146- to 7169th; and the 7170- to 8193th physical bit lines for eight blocks. The spare columns 720 contain the 8194- to 8251th physical bit lines.

Figure 6B:
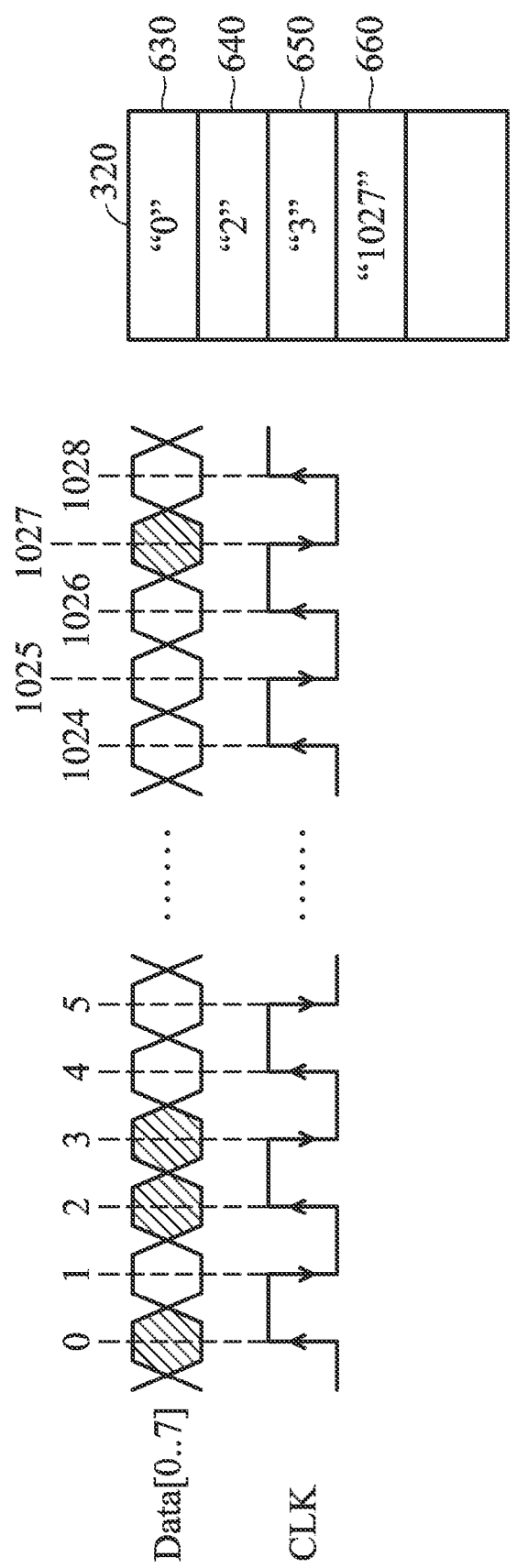
FIG. 6B is a schematic diagram illustrating a second scenario of the bad-column inspection according to an embodiment of the invention.
Figure 8:
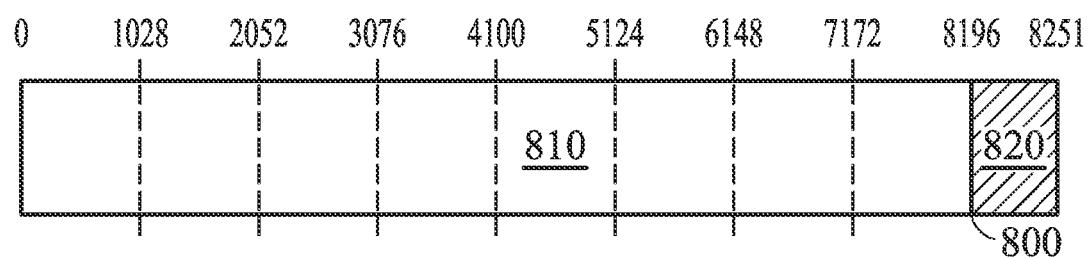

FIG. 6B is a schematic diagram illustrating a second scenario of the bad-column inspection according to an embodiment of the invention. Assume that the 0-, 2- and 3rd physical bit lines malfunction (in shadow of the data line Data[0 . . . 7]): The inspection of the 0- to 1026th bit lines may refer to the description of FIG. 6A and be deduced by the analogy. After the inspection of the 1026th bit line, the bad-column table 320 stores three transactions 630 to 650 containing values "0", "2", and "3", respectively. When the 1027th column is inspected, variables "$Count_{block\_byte}$", "$Count_{block}$" and "$ADDR_{column}$" are 1024, 0 and 1027, respectively. After determining that this column is a regular column (the "No" path of step S516) and a total number of transactions within the bad-column table is odd (the "Yes" path of step S522), the control unit 310 decrements the variable "$Count_{block\_byte}$" by one (step S536), appends a transaction 660 containing the current value of the variable "$ADDR_{column}$" to the bad-column table 320 (step S532), and increments the variable "$ADDR_{column}$" by one (step S534). Next, after determining that the 1028th column is a regular column (the "No" path of step S516), the control unit 310 sets the variables "$Count_{block\_byte}$" and "$ADDR_{column}$" to 1024 and 1029, respectively (step S518). After the inspection of the whole block is complete (the "Yes" path of step S520) and a total number of transactions within the bad-column table 320 is even (the "No" path of step S522), the variable "Count$_{block}$" is incremented by one (step S524) and the variable "Count$_{block\_byte}$" is set to 0. Each of the values stored in the transactions 630 to 660 may indicate a serial number of a physical bit line. FIG. 8 is a schematic diagram illustrating memory cell segmentation for one row after a bad-column inspection according to an embodiment of the invention. After the aforementioned performance of bad-column inspection, the actual data columns 810 may be respectively segmented into the 0- to 1027th; the 1208- to 2051th; the 2052- to 3075th; the 3076- to 4099th; the 4100- to 5123th; the 5124- to 6147th; the 6148- to 7171th; and the 7172- to 8195th physical bit lines for eight blocks. The spare columns 820 contain the 8196- to 8251th physical bit lines.

After all columns are inspected, the control unit 310 determines a total number of columns storing ECC for each block according to a total number of transactions within the bad-column table 320. After the flash memory leaves the factory, the control unit 310 employs the following mechanism to access data. After receiving a data-read request through the processing-unit access interface 340, the control unit 310 reads out designated data from the storage unit 10. Subsequently, the control unit 310 drops bits of malfunctioning columns according to the transactions within the bad-column table 320, and replies to another electronic device with the cleaned data through the processing-unit access interface 340.

Although the embodiment has been described as having specific elements in FIGS. 1 and 3, it should be noted that additional elements may be included to achieve better performance without departing from the spirit of the invention. While the process flow described in FIG. 5 includes a number of operations that appear to occur in a specific order, it should be apparent that these processes can include more or fewer operations, which can be executed serially or in parallel (e.g., using parallel processors or a multi-threading environment).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for accessing a storage unit of a flash memory, performed by a control unit, comprising:
   appending a transaction to a bad-column table each time a bad column of a block within the storage unit is inspected;
   determining whether a total number of transactions within the bad-column table is odd when determining that a last column of the block is a regular column;
   appending a transaction to the bad-column table to indicate that the last column of the block is a bad column when determining that the total number of transactions within the bad-column table is odd;
   appending no transaction to the bad-column table when determining that the total number of transactions within the bad-column table is even;
   reading out designated data through a storage-unit access interface after receiving a data-read request through a processing-unit access interface;
   dropping bits of columns according to the transactions within the bad-column table; and
   replying with cleaned data through the processing-unit access interface.

2. The method of claim 1, wherein the control unit uses a DDR (double data rate) protocol to read out data from the storage unit and write data into the storage unit.

3. The method of claim 2, wherein the control unit latches data on a data line at both rising and falling edges of a signal.

4. The method of claim 1, wherein an inspection of each column comprises:
   writing test data into a designated column;
   reading out data from the designated column;
   determining whether the read-out data matches the test data; and
   if so, determining the designated column is a regular column; otherwise, it is a bad column.

5. The method of claim 1, further comprising:
   an inspection of the whole block is complete when determining that the total number of transactions within the bad-column table is even.

6. The method of claim 1, wherein the appending and determining steps are performed during a pre-test before leaving a factory.

7. The method of claim 6, wherein the total number of transactions within the bad-column table is even after the performance of the pre-test.

8. An apparatus for accessing a storage unit of a flash memory, comprising:
   a storage-unit access interface;
   a processing-unit access interface;
   a non-volatile memory storing a bad-column table; and
   a control unit, coupled to the non-volatile memory, appending a transaction to the bad-column table each time a bad column of a block within the storage unit is detected, determining whether a total number of transactions within the bad-column table is odd when determining that a last column of the block is a regular column, appending a transaction to the bad-column table to indicate that the last column of the block is a bad column when determining that the total number of transactions within the bad-column table is odd, and appending no transaction to the bad-column table when determining that the total number of transactions within the bad-column table is even,
   wherein the control unit reads out designated data through the storage-unit access interface after receiving a data-read request through the processing-unit access interface, drops bits of columns according to the transactions within the bad-column table, and replies with cleaned data through the processing-unit access interface.

9. The apparatus of claim 8, further comprising:
   a storage-unit access interface,
   wherein the control unit uses a DDR (double data rate) protocol to read out data from the storage unit and write data into the storage unit through the storage-unit access interface.

10. The apparatus of claim 9, wherein the control unit latches data on a data line at both rising and falling edges of a signal through the storage-unit access interface.

11. The apparatus of claim 8, wherein, during an inspection of each column, the control unit writes test data into a designated column, reads out data from the designated column, determines whether the read-out data matches the test data, and, if so, determines the designated column is a regular column; otherwise, it is a bad column.

12. The apparatus of claim 8, wherein the control unit determines that an inspection of the whole block is complete when determining that the total number of transactions within the bad-column table is even.

13. The apparatus of claim 8, wherein a total number of transactions within the bad-column table is even after the control unit inspects all columns of the block.

14. A method for accessing a storage unit of a flash memory, performed by a control unit, comprising:
    inspecting bad columns of each block within a storage unit;
    generating a bad-column table according to the inspection results, wherein a total number of transactions within the bad-column table for the block is even, and the total number of transactions for each block equals a total number of actual malfunctioning columns when determining that a last column of the block is a regular column and the total number of transactions within the bad-column table is even, or equals a total number of actual malfunctioning columns plus one when determining that a last column of the block is a regular column and the total number of transactions within the bad-column table is odd;
    reading out designated data through a storage-unit access interface after receiving a data-read request through a processing-unit access interface;
    dropping bits of columns according to the transactions within the bad-column table; and
    replying with cleaned data through the processing-unit access interface.

15. The method of claim 14, wherein each transaction stores a serial number of a physical bit line.

16. The method of claim 14, wherein an inspection of each column comprises:
    writing test data into a designated column;
    reading out data from the designated column;
    determining whether the read-out data matches the test data; and
    if so, determining the designated column is a regular column; otherwise, a bad column.

17. The method of claim 14, wherein the appending and determining steps are performed during a pre-test before leaving a factory.

* * * * *